US009768758B2

(12) United States Patent
Ariyama

(10) Patent No.: US 9,768,758 B2
(45) Date of Patent: Sep. 19, 2017

(54) COMPARISON CIRCUIT

(71) Applicant: SII Semiconductor Corporation, Chiba-shi, Chiba (JP)

(72) Inventor: Minoru Ariyama, Chiba (JP)

(73) Assignee: SII SEMICONDUCTOR CORPORATION, Chiba (JP)

( * ) Notice: Subject to any disclaimer, the term of this patent is extended or adjusted under 35 U.S.C. 154(b) by 0 days.

(21) Appl. No.: 15/139,777

(22) Filed: Apr. 27, 2016

(65) Prior Publication Data
US 2016/0241222 A1 Aug. 18, 2016

Related U.S. Application Data

(63) Continuation of application No. PCT/JP2014/076908, filed on Oct. 8, 2014.

(30) Foreign Application Priority Data

Nov. 11, 2013 (JP) .................... 2013-233408

(51) Int. Cl.
*H03K 5/1252* (2006.01)
*H03K 5/003* (2006.01)
*H03K 5/24* (2006.01)

(52) U.S. Cl.
CPC ........... *H03K 5/1252* (2013.01); *H03K 5/003* (2013.01); *H03K 5/24* (2013.01); *H03K 5/2481* (2013.01)

(58) Field of Classification Search
CPC ...... G01R 19/00; G01R 19/0038; H03K 5/00; H03K 5/003; H03K 5/1252; H03K 5/24; H03K 5/2418; H03K 5/2481; H03K 5/249
(Continued)

(56) References Cited

U.S. PATENT DOCUMENTS 7,570,044 B2 8/2009 Takeda
2008/0197834 A1* 8/2008 Takeda .................... G01R 1/30
324/123 R
(Continued)

FOREIGN PATENT DOCUMENTS

JP 2008-236737 A 10/2008
JP 2010-226234 A 10/2010
(Continued)

OTHER PUBLICATIONS

Search Report, and English language translation thereof, in corresponding International Application No. PCT/JP2014/076908, dated Nov. 25, 2014, 5 pages.

*Primary Examiner* — Lincoln Donovan
*Assistant Examiner* — David Mattison
(74) *Attorney, Agent, or Firm* — Brinks Gilson & Lione

(57) ABSTRACT

A comparison circuit includes a comparator having a first input terminal receiving a first input voltage through a first capacitor, and a second input terminal receiving a second input voltage through a second capacitor, and an output terminal. A first switch has one end connected to the first input terminal and is turned on in a sample phase to set a voltage of the first input terminal as a voltage of the output terminal. A second switch has one end connected to the second input terminal and is turned on in the sample phase to set a voltage of the second input terminal as a reference voltage. A third switch is turned on in a comparison phase to equalize voltages of the other end of the first switch and the other end of the second switch.

4 Claims, 10 Drawing Sheets

(58) Field of Classification Search
USPC .......................................................... 327/63
See application file for complete search history.

(56) References Cited

U.S. PATENT DOCUMENTS

| | | | |
|---|---|---|---|
| 2008/0265880 A1 | 10/2008 | Nishikawa | |
| 2010/0237936 A1* | 9/2010 | Takeda | G01R 33/0029 330/98 |
| 2015/0040687 A1* | 2/2015 | Ariyama | G01R 33/07 73/862.381 |

FOREIGN PATENT DOCUMENTS

| | | |
|---|---|---|
| WO | WO 2006/085503 A1 | 8/2006 |
| WO | WO 2013/161571 A1 | 10/2013 |

* cited by examiner

COMPARISON CIRCUIT

RELATED APPLICATIONS

The present application is a continuation of International Application PCT/JP2014/076908, with an international filing date of Oct. 8, 2014, which claims priority to Japanese Patent Application No. 2013-233408 filed on Nov. 11, 2013, the entire contents of which are incorporated herein by reference.

BACKGROUND OF THE INVENTION

Technical Field

The present invention relates to a comparison circuit that compares the magnitudes of voltages, and particularly to a circuit that suppresses an influence due to a leak current or noise of a circuit element at a high temperature and performs a highly accurate voltage comparison.

Background Art

In electronic circuits in general, a comparison circuit has been used as a circuit that compares a plurality of voltages and determines the magnitudes thereof (refer to, for example, a Patent Document 1).

A circuit diagram of one example of a conventional comparison circuit is shown in FIG. 9. The conventional comparison circuit uses a comparator (comparator) and determines whether a voltage of a difference between two input voltages is larger or smaller than a predetermined voltage. In this comparison, a problem arises in that an offset voltage (input offset voltage) or noise included in the comparator becomes a factor of an error and the accuracy is degraded. The above input offset voltage is generated due to variations in the characteristics of each element that configures an input circuit of the comparator by way of example. Further, the above noise is generated due to flicker noise of a single transistor that configures a circuit, or thermal noise of a single transistor or a resistance element.

In order to reduce the influence of the offset voltage of the above-described comparator, the comparison circuit shown in FIG. 9 takes the following configuration. The comparison circuit has a comparator 5, a switch S3 connected between an inversion input terminal N3 of the comparator 5 and an output terminal, a capacitor 3 connected between the inversion input terminal N3 of the comparator 5 and an input terminal N1, a switch S4 connected between a non-inversion input terminal N4 of the comparator 5 and a comparison voltage input terminal Nref, a switch S1 connected between the non-inversion input terminal N4 of the comparator 5 and a connection point N41, a capacitor 4 connected between an input terminal N2 and the connection point N41, and a switch S2 connected between the connection point N41 and a comparison voltage input terminal N0. Here, a voltage of the comparison voltage input terminal N0 is taken to be V0, a voltage of the comparison voltage input terminal Nref is taken to be Vref, a voltage of the input terminal N1 is taken to be V1, a voltage of the input terminal N2 is taken to be V2, a voltage of the inversion input terminal N3 of the comparator 5 is taken to be V3, a voltage of the non-inversion input terminal N4 of the comparator 5 is taken to be V4, and a voltage of the output terminal of the comparator 5 is taken to be Vo. Further, the input offset voltage of the comparator 5 is taken to be Voa.

The comparison circuit of FIG. 9 is operated with the switches S1 to S4 being controlled as shown in FIG. 10. One cycle for the operation consists of a sample phase $\phi 1$ and a comparison phase $\phi 2$. In the sample phase $\phi 1$, the switch S1 is turned off and the switches S2 to S4 are turned on. In the comparison phase $\phi 2$, the switch S1 is turned on and the switches S2 to S4 are turned off. Further, $\phi 1$ or $\phi 2$ attached to the ends of the voltages of each connection point and each terminal is taken to indicate the voltages in the sample phase $\phi 1$ or the comparison phase $\phi 2$ respectively.

In the sample phase $\phi 1$, the switch S1 is turned off and the switch S2 is turned on so that $\Delta VC4\phi 1=V0-V2\phi 1$ is charged in the capacitor 4. $V4\phi 1=Vref$ since the switch S4 is on. Since the comparator 5 operates as a voltage follower circuit since the switch S3 is on, and has the input offset voltage Voa, $Vo\phi 1=V4\phi 1+Voa$. Further, since the switch S3 is on, $V3\phi 1=Vo\phi 1$, i.e., $V3\phi 1=Vref+Voa$. $\Delta VC3\phi 1=V3\phi 1-V1\phi 1=Vref+Voa-V1\phi 1$ is charged in the capacitor 3. The electrical charges accumulated in the capacitor 3 and the capacitor 4 in the sample phase $\phi 1$ are summarized as follows:

$$\Delta VC3\phi 1 = Vref + Voa - V1\phi 1 \quad (43)$$

$$\Delta VC4\phi 1 = V0 - V2\phi 1 \quad (44)$$

In the comparison phase $\phi 2$, the switches S2 to S4 are turned off and the switch S1 is turned on. Since $\Delta VC3\phi 1$ expressed in the equation (43) is held in the capacitor 3, the voltage V3 is as follows:

$$V3\phi 2 = V1\phi 2 + \Delta VC3\phi 1 \quad (45)$$

On the other hand, since $\Delta VC4\phi 1$ expressed in the equation (44) is held in the capacitor 4, the voltage V4 is as follows:

$$V4\phi 2 = V2\phi 2 + \Delta VC4\phi 1 \quad 46)$$

At last, the voltage V3 expressed in the equation (45) and the voltage V4 expressed in the equation (46) are compared by the comparator 5, and a high level or a low level is output from the output terminal. Considering the input offset voltage Voa of the comparator 5, the voltages compared by the comparator 5 are as follows:

$$(V4\phi 2 + Voa) - V3\phi 2 = \{(V2\phi 2 - V1\phi 2) - (V2\phi 1 - V1\phi 1)\} - (Vref - V0) \quad (47)$$

It has been shown that the input offset voltage Voa of the comparator 5 is not included in the equation (47) and the offset voltage is canceled. Accordingly, in the comparison phase $\phi 2$, the comparator 5 compares the input voltage component $\{(V2\phi 2-V1\phi 2)-(V2\phi 1-V1\phi 1)\}$ and the reference voltage component $(Vref-V0)$. Thus, it is possible to realize a comparison circuit from which the influence of an offset voltage component of the comparator, which becomes an error factor, is removed and which provides a high accuracy output with small error.

CITATION LIST

Patent Documents

Patent Document 1: Japanese Patent Application Laid-Open No. 2008-236737

SUMMARY OF THE INVENTION

Problems to be Solved by the Invention

There has however recently been a tendency for each circuit mounted in an automobile or the like to require an operation at a higher temperature and require higher accuracy. The conventional comparison circuit such as described above was accompanied by a problem that the electrical charge was injected in the capacitor due to the off-leak current of each switch, which was turned to be prominent at the high temperature, and the error occurred in the result of comparison. Specifically, in the comparison circuit of FIG. 9, in the comparison phase φ2, the leak current of only the switch S3 flows in the capacitor 3, whereas the leak currents of the switches S2 and S4 flow in the capacitor 4. Therefore, the amount of fluctuation in the voltage at the input of the comparator differs on the inversion input terminal N3 side and the non-inversion input terminal N4 side, and an error has been generated in the comparison result. In general, since the leak current of the transistor that configures each switch increases as the temperature rises, the higher the temperature becomes, the more the error becomes remarkable. Further, in the case where the transistor is a MOS transistor, since a leak current between channels depends on the difference in voltage between the drain and source thereof, the flowing direction or magnitude of the leak current of each switch differs due to the voltage on the side not connected to the capacitor in the turned-off switch, and an error has been generated in a comparison result.

Further, the conventional comparison circuit was accompanied by a problem that since the connections of the switches to the respective capacitors were asymmetrical even as for the influence of noise components (e.g., channel charge injection and clock feed-through) generated when the transistor element that configures each switch was transitioned from on to off, the amount of fluctuation in the voltage at the input of the comparator due to the noise component of each switch differs on the inversion input terminal N3 side and the non-inversion input terminal N4 side, thus resulting in the factor of causing the error.

The present invention has been made in view of such points, and aims to provide a comparison circuit capable of removing the influence of an input offset voltage of a comparator with a simple circuit configuration, suppress the influence of an error due to an off-leak current or a noise component of a switch and obtain a highly accurate comparison/determination result.

Means for Solving the Problems

In order to solve the conventional problems such as described above, the comparison circuit of the present invention is configured as follows:

The comparison circuit including a comparator having a first input terminal inputted with a first input voltage through a first capacitor, a second input terminal inputted with a second input voltage through a second capacitor, and an output terminal; a first switch which has one end connected to the first input terminal and is turned on in a sample phase to set a voltage of the first input terminal as a voltage of the output terminal; a second switch which has one end connected to the second input terminal and is turned on in the sample phase to set a voltage of the second input terminal as a reference voltage; and a third switch which is turned on in a comparison phase to equalize voltages of the other end of the first switch and the other end of the second switch.

Advantageous Effect of the Invention

According to a comparison circuit of the present invention, switches, capacitors and a comparator are effectively utilized to thereby make it possible to remove with a simple circuit configuration, errors generated due to an offset component generated in the comparator, an off-leak current component of the switch and an noise component of the switch, and perform a highly accurate comparison over a wide temperature region.

MODE FOR CARRYING OUT THE INVENTION

A comparison circuit of the present invention can widely be used as a high accuracy comparison circuit in a semiconductor circuit. The comparison circuit of the present invention will hereinafter be described with reference to the drawings.

FIRST EMBODIMENT

Figure 1:
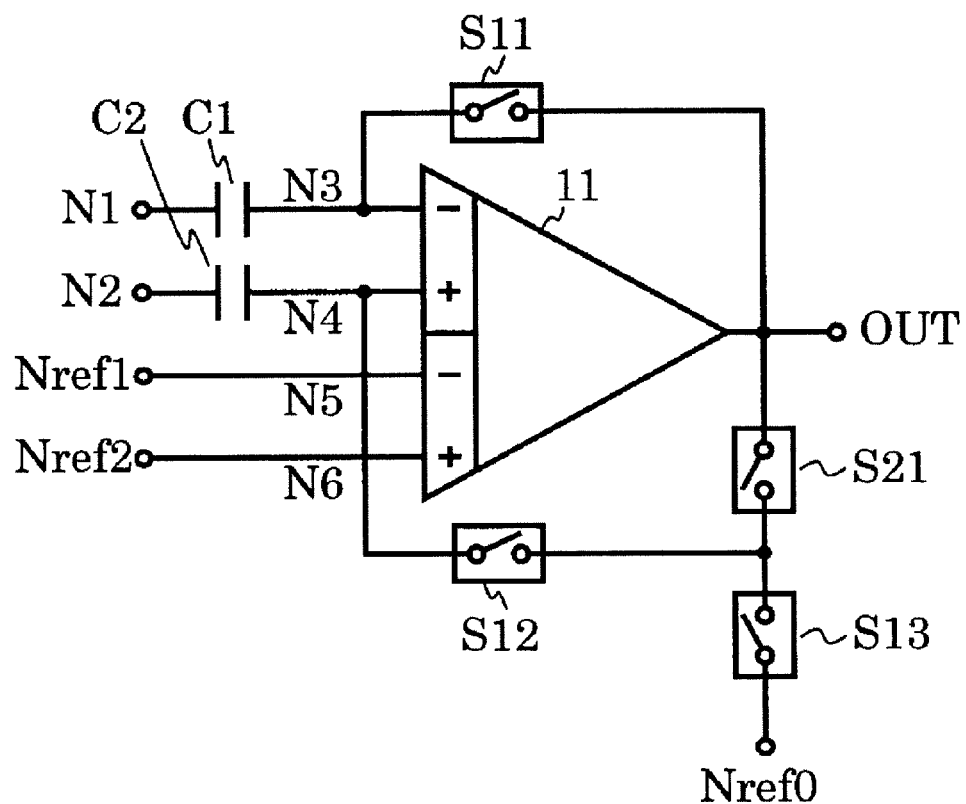
FIG. 1 is a circuit diagram of a comparison circuit of a first embodiment.

FIG. 1 is a circuit diagram of a comparison circuit of a first embodiment. The comparison circuit of the first embodiment includes a comparator 11, capacitors C1 and C2, and switches S11, S12, S13 and S21.

The comparator 11 has four input terminals and one output terminal. Specifically, it has a first input terminal N3 of a first differential input pair, a second input terminal N4 of the first differential input pair, a first input terminal N5 of a second differential input pair, a second input terminal N6 of the second differential input pair and an output terminal OUT. The capacitor C1 has two terminals, one terminal of which is connected to the first input terminal N3 of the first differential input pair of the comparator 11 and the other terminal thereof is connected to an input terminal N1. The capacitor C2 has two terminals, one terminal of which is connected to the second input terminal N4 of the first differential input pair of the comparator 11 and the other terminal thereof is connected to an input terminal N2. The switch S11 has two terminals, one terminal of which is connected to the first input terminal N3 of the first differential input pair of the comparator 11 and the other terminal thereof is connected to the output terminal OUT of the comparator 11. The switch S12 has two terminals, one terminal of which is connected to the second input terminal N4 of the first differential input pair of the comparator 11. The switch S13 has two terminals, one terminal of which is connected to a reference voltage input terminal Nref0. The switch S21 has two terminals, one terminal of which is connected to the output terminal OUT of the comparator 11. The other terminals of the switches S12, S13 and S21 are respectively connected in common. Each of the switches S11, S12, S13 and S21 is controlled in on/off by a switch control signal (not shown in the circuit diagram). A first reference voltage input terminal Nref1 is connected to the first input terminal N5 of the second differential input pair of the comparator 11. A second reference voltage input terminal Nref2 is connected to the second input terminal N6 of the second differential input pair of the comparator 11.

The operation of the comparison circuit of the first embodiment will next be described.

First, the operation of the comparator 11 will be described. The comparator 11 has the function of outputting the sum of a value obtained by amplifying the difference between a pair of input voltages and a value obtained by amplifying the difference between another pair of input voltages. A diagram that conceptually shows this amplifying function is illustrated in FIG. 3.

Figure 3:
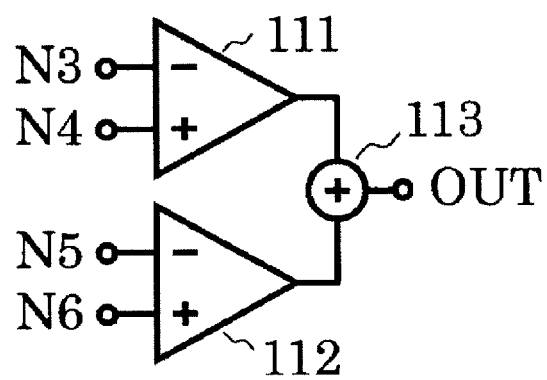
FIG. 3 is a circuit diagram illustrating one example of a comparator used in a comparison circuit of the present invention.

FIG. 3 is a conceptual diagram illustrating the function of the comparator 11.

The comparator 11 of FIG. 3 has differential amplifiers 111 and 112 and an adder 113 and is connected and configured as follows. The first input terminal N3 of the first differential input pair of the comparator 11 is connected to an inversion input terminal of the differential amplifier 111, and the second input terminal N4 of the first differential input pair is connected to a non-inversion input terminal of the differential amplifier 111. The first input terminal N5 of the second differential input pair is connected to an inversion input terminal of the differential amplifier 112, and the second input terminal N6 of the second differential input pair is connected to a non-inversion input terminal of the differential amplifier 112. The output of the differential amplifier 111 and the output of the differential amplifier 112 are respectively connected to the inputs of the adder 113. The output of the adder 113 is connected to the output terminal OUT of the comparator 11.

The comparator 11 is connected as above and operated as follows.

The differential amplifier 111 amplifies the difference between the voltages of the two input terminals N3 and N4 and inputs the same to the adder 113. The differential amplifier 112 amplifies the difference between the voltages of the two input terminals N5 and N6 and inputs the same to the adder 113. The adder 113 outputs the sum of the outputs of the differential amplifier 111 and the differential amplifier 112. This amplifying function is expressed by an equation as follows:

$$Vo = A1 \times (V4 - V3) + A2 \times (V6 - V5) \quad (1)$$

where A1 and A2 are amplification factors of the differential amplifiers 111 and 112 respectively. Further, the voltages of the respective terminals N3 to N6 and OUT are taken to be V3 to V6 and Vo respectively.

In the comparison circuit of FIG. 1, the first input terminal N3 of the first differential input pair of the comparator 11 shown in FIG. 3, and the output terminal OUT are connected to both ends of the switch S11. Since Vo and V3 become approximately equal voltages in a state in which the switch S11 is on, Vo is represented from the equation (1) as follows:

$$Vo = A1/(1+A1) \times V4 + A2/(1+A1) \times (V6 - V5) \quad (2)$$

For convenience of explanation, if the amplification factors A1 and A2 are taken to be sufficiently large, the following equation is obtained.

$$Vo = V4 + (A2/A1) \times (V6 - V5) \quad (3)$$

That is, in the state in which the switch S11 is on, the output terminal OUT of the comparator 11 and the first input terminal N3 of the first differential input pair, i.e., the inversion input terminal of the differential comparator 111 are electrically connected to each other to form a feedback loop, which performs an operation like a kind of voltage follower that the output voltage Vo not only follows the input voltage V4 but also outputs even a sum with a voltage obtained by amplifying the difference between the voltages of input V6 and V5 with the ratio between the amplification factors A2 and A1.

On the other hand, since no feedback loop is formed in the comparator 11 in a state in which the switch S11 is off, the comparator 11 is operated as a comparator itself. The following is obtained from the equation (1):

$$Vo = A1 \times \{(V4 - V3) + (A2/A1) \times (V6 - V5)\} \quad (4)$$

Therefore, in other words, the comparator 11 performs, in the off state of the switch S11, a comparison operation of amplifying, with the sufficiently large amplification factor A1, a voltage of the sum of a voltage of a difference between V4 and V3 and a voltage obtained by amplifying the difference between V6 and V5 with the ratio between the amplification factors A2 and A1, and outputting a high level signal (positive power supply voltage level in general) or a low level signal (negative power supply voltage level or GND level in general) from the output terminal OUT.

Here, when input offset voltages of the comparator 11 are taken to be Voa1 at the second input terminal N4 of the first differential input pair and Voa2 at the second input terminal N6 of the second differential input pair, the equation representing the operation of the comparator 11 having taken into consideration the input offset voltages is represented as follows from the equations (3) and (4) when the switch S11 is on and off.

When the switch S11 is on:

$$Vo = (V4 + Voa1) + (A2/A1) \times (V6 + Voa2 - V5) \quad (5)$$

When the switch S11 is off:

$$Vo = A1 \times \{(V4 + Voa1 - V3) + (A2/A1) \times (V6 + Voa2 - V5)\} \quad (6)$$

The above is the description of the operation of the comparator 11 shown in FIG. 3.

Figure 2:
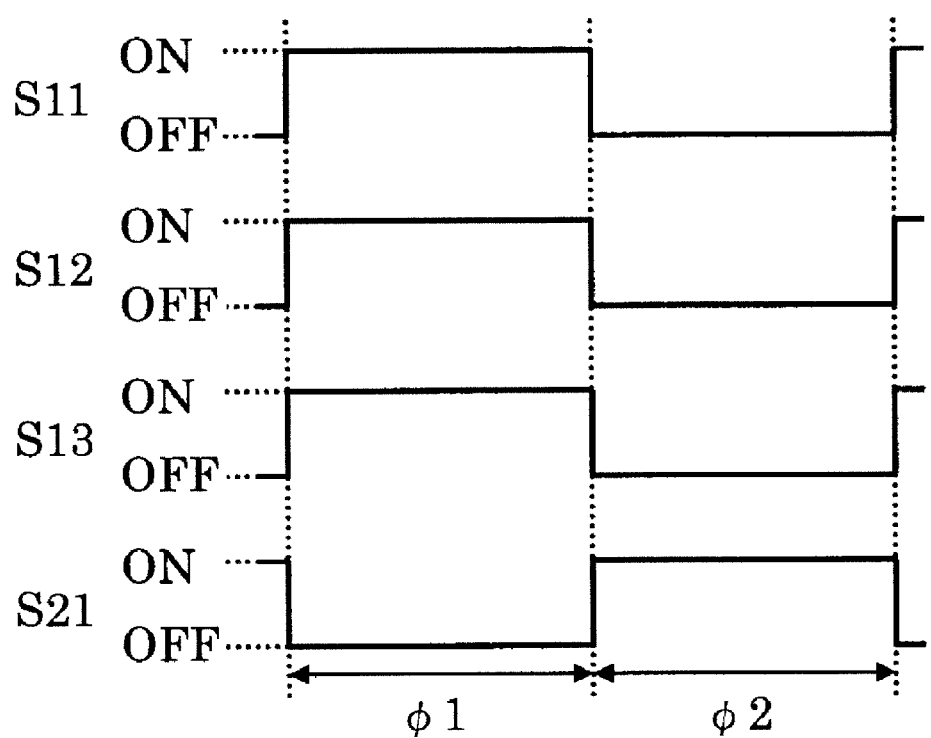
FIG. 2 is a diagram illustrating operations of respective switches of the first embodiment.

FIG. 2 is a diagram illustrating the operation of each switch.

One cycle for the comparison operation consists of two phases of a sample phase φ1 and a comparison phase φ2. The switches S11, S12, S13 and S21 are respectively controlled by switch control signals shown in FIG. 2. The switches S11, S12 and S13 are respectively turned on in the sample phase φ1 and turned off in the comparison phase φ2. Further, the switch S21 is turned off in the sample phase φ1 and turned on in the comparison phase φ2.

An outline of the operation of the comparison circuit of FIG. 1 in each phase will be described. The sample phase φ1 is a phase for storing in the capacitors C1 and C2, a voltage V1 of the input terminal N1, a voltage V2 of the input terminal N2, a voltage Vref1 of the first reference voltage input terminal Nref1, a voltage Vref2 of the second reference voltage input terminal Nref2, and an offset voltage of the comparator 11. The comparison phase φ2 is a phase for comparing the difference in voltage between the input terminal N1 and the input terminal N2 and the voltage difference between the first reference voltage Vref1 and the second reference voltage Vref2 while canceling each offset component of the comparator 11 in the sample phase φ1.

The sample phase φ1 and the comparison phase φ2 will be described below in detail.

In the sample phase φ1, the switches S11, S12 and S13 are on and the switch S21 is turned off. Thus, the respective input terminals of the comparator 11 are supplied with the following voltages. A voltage Vo of the output terminal OUT is applied to the first input terminal N3 of the first differential input pair of the comparator 11. A reference voltage Vref0 is applied to the second input terminal N4 of the first differential input pair. The first reference voltage Vref1 is applied to the first input terminal N5 of the second differential input pair. The second reference voltage Vref2 is applied to the second input terminal N6 of the second differential input pair. Since the comparator 11 is operated as represented by the equation (5) when the switch S11 is on, the voltage of the first input terminal N3 of the first differential input pair is represented as follows:

$$V3\phi1 = Vref0\phi1 + Voa1\phi1 + (A2/A1) \times (Vref2\phi1 + Voa2\phi1 - Vref1\phi1) \quad (7)$$

φ1 of the end of each voltage is indicative of being the voltage in the sample phase φ1. Subsequently, other voltages and the comparison phase φ2 are also expressed in like manner.

A difference ΔVC1φ1 between the voltage V3 and the voltage V1 is charged in the capacitor C1.

$$\Delta VC1\phi1 = V3\phi1 - V1\phi1 \quad (8)$$

Substituting the equation (7) into the above equation yields the following equation:

$$\Delta VC1\phi1 = -V1\phi1 + Vref0\phi1 + Voa1\phi1 + (A2/A1) \times (Vref2\phi1 + Voa2\phi1 - Vref1\phi1) \quad (9)$$

On the other hand, a difference ΔVC2φ1 between the voltage V4 and the voltage V2 is charged in the capacitor C2.

$$\Delta VC2\phi1 = V4\phi1 - V2\phi1 \quad (10)$$

Since the reference voltage Vref0 has been applied to the second input terminal N4 of the first differential input pair, the following equation is obtained from the equation (10):

$$\Delta VC2\phi1 = Vref0\phi1 - V2\phi1 \quad (11)$$

On the other hand, in the comparison phase φ2, the switches S11, S12 and S13 are off and the switch S21 is turned on. Since the switch S11 is turned off and ΔVC1φ1 has been charged in the capacitor C1, the voltage V3 is determined by the voltage V1 and ΔVC1φ1 and represented by the following equation:

$$V3\phi2 = V1\phi2 + \Delta VC1\phi1 \quad (12)$$

Substituting the equation (9) indicative of ΔVC1φ1 charged in the capacitor C1 into the above equation is as follows:

$$V3\phi2 = V1\phi2 - V1\phi1 + Vref0\phi1 + Voa1\phi1 + (A2/A1) \times (Vref2\phi1 + Voa2\phi1 - Vref1\phi1) \quad (13)$$

Further, since the switch S12 is turned off and ΔVC2φ1 has been charged in the capacitor C2, the voltage V4 is determined by the voltage V2 and ΔVC2φ1 and represented by the following equation:

$$V4\phi2 = V2\phi2 + \Delta VC2\phi1 \quad (14)$$

Substituting the equation (11) indicative of ΔVC2φ1 charged in the capacitor C2 into the above equation is as follows:

$$V4\phi2 = V2\phi2 - V2\phi1 + Vref0\phi1 \quad (15)$$

Further, since the comparator 11 is operated as expressed in the equation (6) when the switch S11 is off, the voltage Vo of the output terminal OUT of the comparator 11 is represented as follows:

$$Vo\phi2 = A1 \times \{(V4\phi2 + Voa1\phi2 - V3\phi2) + (A2/A1) \times (Vref2\phi2 + Voa2\phi2 - Vref1\phi2)\} \quad (16)$$

Substituting V3φ2 expressed in the equation (13) and V4φ2 expressed in the equation (15) into the above equation yields the following equation:

$$Vo\phi2 = A1 \times [\{(V2\phi2 - V1\phi2) - (V2\phi1 - V1\phi1) + (Voa1\phi2 - Voa1\phi1)\} - (A2/A1) \times \{(Vref2\phi1 - Vref1\phi1) - (Vref2\phi2 - Vref1\phi2 - (Voa2\phi2 - Voa2\phi1)\}] \quad (13)$$

When, in order to make it easier to understand the equation (17), voltage components supplied from the input terminal N1 and the input terminal N2 are taken to be ΔVin, and voltage components supplied from the first reference voltage input terminal Nref1 and the second reference voltage input terminal Nref2 are taken to be ΔVref, the equation (17) can be represented as follows:

$$Vo\phi2 = A1 \times [\{\Delta Vin + (Voa1\phi2 - Voa1\phi1)\} - (A2/A1) \times \{\Delta Vref - (Voa2\phi2 - Voa2\phi1)\}] \quad (18)$$

where $$\Delta Vin = (V2\phi2 - V1\phi2) - (V2\phi1 - V1\phi1) \quad (19), \text{ and}$$

$$\Delta Vref = (Vref2\phi1 - Vref1\phi1) - (Vref2\phi2 - Vref1\phi2) \quad (20)$$

Here, the input offset voltages Voa1 and Voa2 of the comparator 11 are not constant values because they strictly indicate a temporal change and a change in temperature (temperature drift). If, however, the times taken for the sample phase φ1 and the comparison phase φ2 are times sufficiently short relative to the temporal and temperature changes in the input offset voltages, the values of the input offset voltages can be assumed to be approximately equal values in the sample phase φ1 and the comparison phase φ2. Accordingly, in the equation (18), Voa1φ2−Voa1φ1 and Voa2φ2−Voa2φ1 become values of almost zero, and the offset components of the comparator 11 are removed upon the comparison operation by the comparator 11 in the comparison phase φ2. Thus, the equation (18) can be represented as follows:

$$Voa\phi2 = A1 \times \{\Delta Vin - (A2/A1) \times \Delta Vref\} \quad (21)$$

Thus, a result of comparison between the voltage components ΔVin supplied from the input terminal N1 and the input terminal N2 and the voltage components ΔVref supplied from the first reference voltage input terminal Nref1 and the second reference voltage input terminal Nref2 is amplified with a sufficiently large amplification factor A1 and eventually outputted as a high level signal or a low level signal from the output terminal OUT of the comparator 11. As an example, there are mentioned voltages applied to the input terminal N1 and the input terminal N2 to determine ΔVin. For example, when the voltages are input from outside in such a manner that V1φ2=V2φ1=V1' and V1φ1=V2φ2=V2', ΔVin becomes ΔVin=2×(V2'−V1') from the equation (19), and a voltage of 2 times as high as the difference between V1' and V2' is input to the comparator 11 as an input voltage component. Also, on the other hand, in terms of the first reference voltage Vref1 and the second reference voltage Vref2 to determine ΔVref, for example when the reference voltages are applied from outside such that Vref2φ1=Vref1φ1=Vref2φ2=Vref2' and Vref1φ2=Vref1', ΔVref becomes ΔVref=Vref1'−Vref2' from the equation (20), and a voltage of the difference between Vref1' and Vref2' is input to the comparator 11 as a reference voltage component. For simplicity, assuming that the differential amplifiers 111 and 112 are designed in such a manner that A1=A2, the equation (21) is represented as follows in this example:

$$Vo\phi2 = A1 \times \{2 \times (V2'-V1') - (Vref1'-Vref2')\} \quad (22)$$

A result of comparison between the input voltage component 2×(V2'−V1') and the reference voltage component (Vref1'−Vref2') is obtained.

When attention is paid to the equation (17) here, the term of Vref1 is not included in this equation. This is because the term of Vref0φ1 is included in both of the voltage ΔVC1φ1 charged in the capacitor C1 and ΔVC2φ1 charged in the capacitor C2, and the term of Vref1 is cancelled in the process of deriving Voφ2. This indicates that in the comparison circuit of the present embodiment, the comparison result does not depend on the voltage of Vref0 even if the voltage applied to the reference voltage input terminal Nref0 takes any value. In an actual circuit, there is a restriction of an in-phase input voltage range on the range of voltages inputtable to the comparator 11. When the range deviates from this voltage range, there is a possibility that a highly accurate comparison will not be performed normally. Even if the voltages of the input terminal N1 and the input terminal N2 targeted for comparison are voltages that come outside the in-phase input voltage range of the comparator 11, a comparison circuit-magnetic sensor device of the present embodiment has an advantage in that the highly accurate comparison is made possible by selecting the voltage of the reference voltage input terminal Nref0 to fall within the in-phase input voltage range of the comparator 11. If another expression is taken, it can be said that it has an advantage in that the in-phase input voltage range required for the comparator 11 can remarkably be relaxed.

Next, the effects by the switches S13 and S21 will be described. In the comparison phase φ2, the switch S13 is turned off and the switch S21 is turned on to perform an operation so as to make the voltage of the other terminal of the switch S12 equal to the voltage Vo of the output terminal OUT of the comparator 11. Accordingly, the voltages of the other terminals of the switches S11 and S12 held in an off state become equal to the voltage Vo of the output terminal OUT of the comparator 11.

Consider temporarily where the switch S13 remains on in the comparison phase φ2 similarly to the sample phase φ1, and the switch S21 remains off in the comparison phase φ2 similarly to the sample phase φ1, in other words, the switches S13 and S21 do not exist and the other terminal of the switch S12 is directly connected to the reference voltage input terminal Nref0. In this case, in the comparison phase φ2, the other voltage of the switch S11 becomes equal to the voltage Vo of the output terminal OUT of the comparator 11 and becomes a voltage of a high level signal (positive power supply voltage level in general) or a low level signal (negative power supply voltage level or GND level in general) according to the result of comparison. On the other hand, the other voltage of the switch S12 becomes equal to the voltage of the reference voltage input terminal Nref0. As described above, the voltage of the reference voltage input terminal Nref0 is preferably selected to fall within the in-phase input voltage range of the comparator 11. In general, the voltage of the reference voltage input terminal Nref0 is set to a voltage between the positive power supply voltage level and the negative power supply level (or GND level), for example, an intermediate voltage. Accordingly, in the comparison phase φ2, the voltage of the other terminal of the switch S11 and the voltage of the other terminal of the switch S21 become voltages very large in difference. On the other hand, the voltages of one terminal of the switches S11 and S12 are the voltages expressed by the equations (13) and (15) respectively. Though they are not necessarily equal voltages, both become voltages based on the voltage of the reference voltage input terminal Nref0 in the sample phase φ1 and become voltages approximately close to each other particularly near a boundary condition under which a comparison/determination result of the comparator 11 is switched (at least there no occurs a voltage difference of such an extent that one of the voltages becomes a positive or negative power supply voltage and the other thereof becomes an intermediate voltage between the positive and negative power supply voltages). From the above, the difference in voltage between both terminals of the switch S11 held in the off state and the difference in voltage between both terminals of the switch S12 differ greatly. As the ideal characteristics of the switch held in the off state, no flow of current between the terminals without depending on the difference in voltage between both terminals is cited. In the actual circuit, however, a leak current flows between both terminals of the switch and changes according to the difference in voltage between both terminals. Therefore, there are mentioned a lot of configurations of switch circuits to reduce the leak current, but the leak current is not made zero and takes a finite value. Since in the switch S12, the voltage of one terminal corresponds to the voltage based on the Vref0φ1 expressed in the equation (15), and the voltage of the other terminal corresponds to the voltage of Vref0φ1, the leak current flows but becomes a relatively small leak current. Since in the switch S11, the voltage of one terminal corresponds to the voltage based on the Vref0φ1 expressed in the equation (13), and the voltage of the other terminal is equal to the voltage Vo of the output terminal OUT of the comparator 11 and corresponds to the voltage of the high level signal (positive power supply voltage level in general) or the low level signal (negative power supply voltage level or GND level in general), a current leak current larger than the leak current of the switch S12 flows. Accordingly, the leak currents that flow in the capacitor C1 and the capacitor C2 differ from each other, and the amount of fluctuation in the voltage of the first input terminal N3 of the first differential input pair and the amount of fluctuation in the voltage of the second input terminal N4 of the first differential input pair differ from each other, thus resulting in a factor that an error occurs in the result of comparison. Generally, since the leak current tends to increase with raising of the temperature, the error of the comparison circuit increases as the temperature becomes higher.

For the above-described temporary case, in the present embodiment, in the comparison phase φ2, the switch S13 is turned off and the switch S21 is turned on to control the voltage of the other terminal of the switch S12 to be equal to the voltage Vo of the output terminal OUT of the comparator 11. Therefore, the difference between the difference in voltage between both terminals of the switch S11 and the difference in voltage between both terminals of the switch S12 is improved so as to be small, so that the difference between the leak currents becomes small. Thus, the difference between the leak currents that flow in the capacitor C1 and the capacitor C2 is improved so as to be small, and as a result, the error that occurs in the result of comparison can be reduced. Accordingly, the influence of the error caused by the leak current of each switch can be suppressed by the switches S13 and S21, and a highly accurate comparison/determination result can hence be obtained.

Further, the nonideal components of the switch include, in addition to the above leak current, a noise component generated when a transistor element that configures each switch is transitioned from on to off, e.g., channel charge injection and clock feed-through. The present embodiment is operated in such a manner that since the switches S11 and S12 are connected to a connection point of one terminal of the capacitor C1 and the first input terminal N3 of the first differential input pair of the comparator 11, and a connection point of one terminal of the capacitor C2 and the second input terminal N4 of the first differential input pair of the comparator 11 such that they become symmetrical with respect to each other respectively, electrical charges generated due to the noise components of the switches are approximately equally injected to the respective connection points, and the amounts of fluctuations in the voltage of the first input terminal N3 of the first differential input pair and the voltage of the second input terminal N4 of the first differential input pair become approximately equal to each other though both voltages fluctuate. Accordingly, it is possible to suppress the influence of errors due to the noise components generated when the switch is transitioned from the on state to the off state and obtain a highly accurate comparison/determination result.

Here, one example of a circuit configuration of the comparator 11 being an element that configures the magnetic sensor device of FIG. 1 is shown. The function of the comparator 11 shown by the conceptual diagram of FIG. 3 can more specifically be realized by such a circuit configuration as shown in FIG. 4 by way of example.

Figure 4:
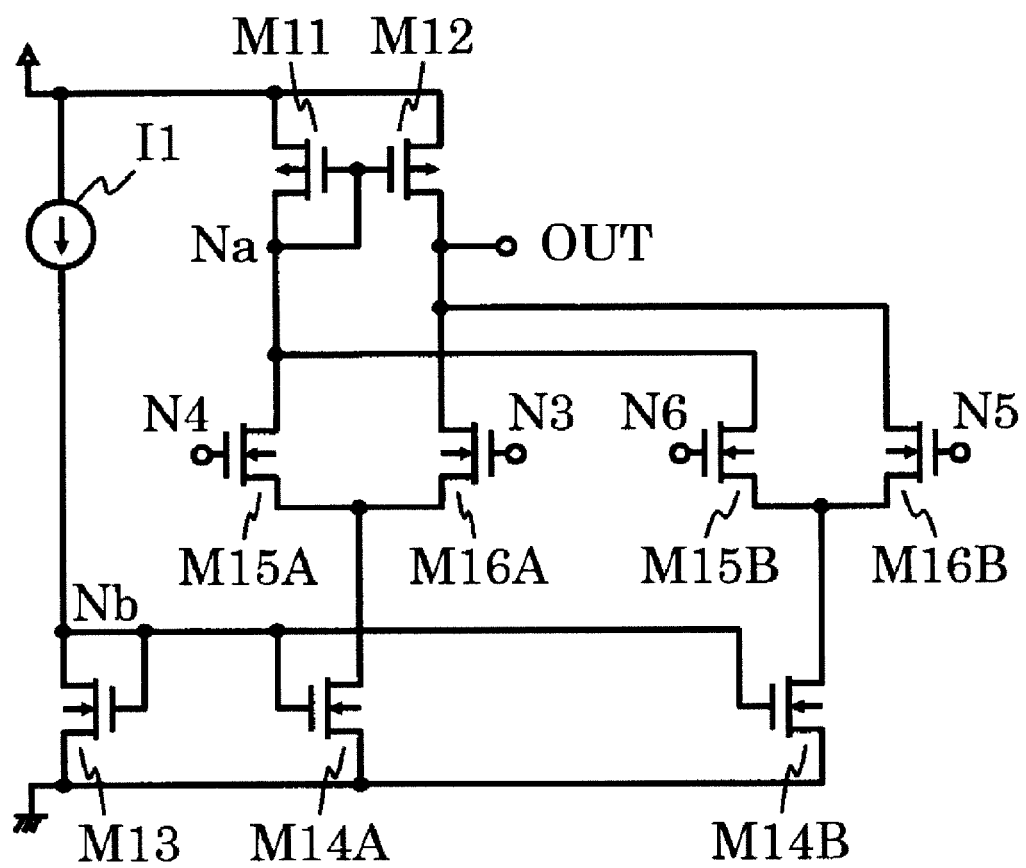
FIG. 4 is a circuit diagram illustrating another example of the comparator used in the comparison circuit of the present invention.

FIG. 4 is one example of the circuit configuration of the comparator 11.

The comparator 11 has a constant current circuit I1, NMOS transistors M13, M14A, M14B, M15A, M16B, M15B and M16B, and PMOS transistors M11 and M12 and is connected and configured as follows. One of the constant current I1 is connected to a power supply voltage terminal VDD, and the other thereof is connected to a drain and gate of the NMOS transistor M13. This connection point is taken to be Nb. Nb is connected to a gate of the NMOS transistor M14A and a gate of the NMOS transistor M14B. Sources of the NMOS transistors M13, M14A and M14B are connected to a ground terminal VSS. Sources of the NMOS transistors M15A and M16A are connected to a drain of M14A. Sources of the NMOS transistors M15B and M16B are connected to a drain of M14B. Drains of the NMOS transistors M15A and M15B are connected to a drain of the PMOS transistor M11. This connection point is taken to be Na. Drains of the NMOS transistors M16A and M16B are connected to a drain of the PMOS transistor M12. This connection point is connected to an output terminal OUT of the comparator 11. Gates of the PMOS transistors M11 and M12 are connected to the connection point Na, and sources thereof are connected to the power supply voltage terminal VDD. Gates of the NMOS transistors M15A and M16A are respectively connected to the second input terminal N4 and first input terminal N3 of the first differential input pair. Gates of the NMOS transistors M15B and M16B are respectively connected to the second input terminal N6 and first input terminal N5 of the second differential input pair.

The comparator 11 is connected as described above and operated as follows.

The constant current circuit I1 generates a constant current and supplies it to the NMOS transistor M13. The NMOS transistors M13, M14A and M14B configure a current mirror circuit. A current based on a current that flows between the drain and source of M13 flows between the drains and sources of the NMOS transistors M14A and M14B. The five transistors comprised of the NMOS transistors M14A, M15A and M16A and the PMOS transistors M11 and M12 configure a differential amplifier and are operated to amplify the difference in voltage between the gates of the NMOS transistors M15A and M16A that configure the first differential input pair, i.e., the difference in voltage between the second input terminal N4 of the first differential input pair and the first input terminal N3 of the first differential input pair and output it to the output terminal OUT. This amplification factor is taken to be A1. Here, the operations of the current mirror circuit configuration and the differential amplifier configuration have been described in detail in a document of a CMOS analog circuit or the like. A detail description thereof will be omitted here. Further, the five transistors comprised of the NMOS transistors M14B, M15B and M16B and the PMOS transistors M11 and M12 also configure a differential amplifier and are operated to amplify the difference in voltage between the gates of the NMOS transistors M15B and M16B that configure the second differential input pair, i.e., the difference in voltage between the second input terminal N6 of the second differential input pair and the first input terminal N5 of the second differential input pair and output it to the output terminal OUT. This amplification factor is taken to be A2. Further, the drain of the NMOS transistor M15A that configures the first differential input pair, and the drain of the NMOS transistor M15B that configures the second differential input pair are connected to the drain of the PMOS transistor M11 at the connection point Na, and the drain of the NMOS transistor M16A that configures the first differential input pair and the drain of the NMOS transistor M16B that configure the second differential input pair are connected to the drain of the PMOS transistor M12 at the output terminal OUT, whereby the voltages amplified by the respective differential input pairs of the first differential input pair and the second differential input pair are operated so as to be added at the connection point Na and the output terminal OUT. If these operations are represented by an equation, the following is obtained:

$$Vo = A1 \times (V4 - V3) + A2 \times (V6 - V5) \quad (23)$$

That is, an operation equivalent to the equation (1) is performed.

The operation of the comparison circuit of the first embodiment has been described as above. It has been shown that it is possible to remove the influence of the input offset voltages of the comparator with the simple circuit configuration, suppress the influence of the error due to the off-leak current or the noise component of each switch and obtain the highly accurate comparison/determination result.

Although the present description has shown the specific circuit configuration of the comparator 11 and the timing chart for switch control, the comparator 11 is not necessarily limited to this configuration if a configuration is adopted which performs the operations described in the present description. While the timings at which the on or off of the switches is switched upon transition from the sample phase φ1 to the comparison phase φ2 or the reverse transition have been described to be provided simultaneously in FIG. 2, for example, each timing may be controlled to be shifted such that the switch S12 is turned off after turning off of the switch S11 and further, thereafter S13 is turned off and S21 is turned on. In the cases where the transient response characteristic of the comparator 11 is good and the parasitic capacity between the first input terminal N3 of the first differential input pair of the comparator 11 and the second input terminal N4 of the first differential input pair thereof is a non-negligible magnitude, etc., there is a case where switching noise generated when the switch S12 is turned off is propagated from the second input terminal N4 of the first differential input pair to the first input terminal N3 of the first differential input pair, and an non-negligible error occurs in the voltage charged in the capacitor C1. In such a case, the timing at which the switch S12 is turned off is more preferably delayed than the timing at which the switch S11 is turned off.

Further, the present description includes one example of the input voltages applied to the input terminal N1 and the input terminal N2, and one example of the voltages applied to the first reference voltage input terminal Nref1 and the second reference voltage input terminal Nref2, but is not necessarily limited thereto. For example, when the comparison circuit of the present embodiment is applied to the signal detection circuit that performs the logic output according to the strength of the physical quantity applied to the sensor element as shown in the prior art, examples of input voltage components are as follows:

$$V1\phi1 = Vcm\phi1 + Vsig\phi1 + Voff\phi1$$

$$V2\phi1 = Vcm\phi1 - Vsig\phi1 - Voff\phi1$$

$$V1\phi2 = Vcm\phi2 - Vsig\phi2 + Voff\phi2$$

$$V2\phi2 = Vcm\phi2 + Vsig\phi2 - Voff\phi2$$

where Vcm is an in-phase voltage component of a signal voltage of the sensor element, Vsig is a signal voltage component of the sensor element, and Voff is an offset voltage component (error factor) of the sensor element. Substituting the above respective input voltages into the equation (19) is as follows:

$$\Delta Vin = 2\times(Vsig\phi2 + Vsig\phi1) - 2\times(Voff\phi2 - Voff\phi1) \quad (24)$$

Since the offset voltage components of the sensor element indicate values approximately equal to each other in the sample phase $\phi1$ and the comparison phase $\phi2$, they are cancelled. Accordingly, only the signal voltage components of the sensor element are input to the comparator 11 as the input voltage components. Even such a case of input voltage components will not depart from the viewpoint corresponding to the gist of the present invention, of removing the influence of the input offset voltages of the comparator and suppressing the influence of the error due to the off-leak current or noise component of the switch, and obtaining the highly accurate comparison/determination result.

SECOND EMBODIMENT

Figure 5:
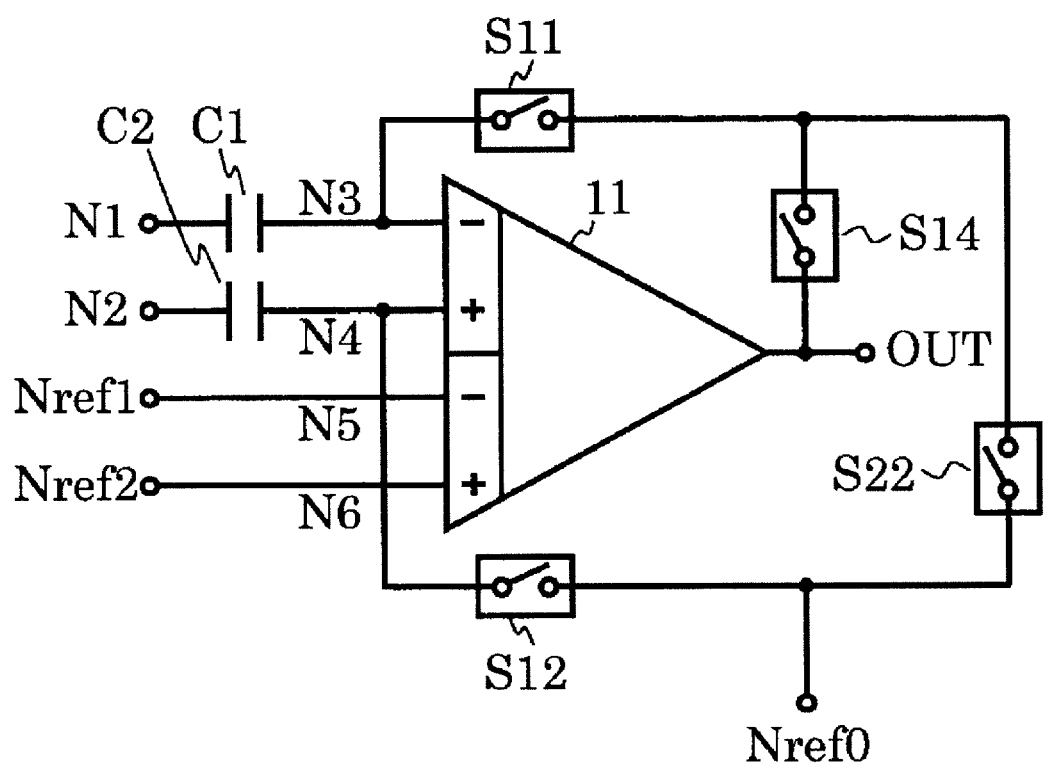
FIG. 5 is a circuit diagram of a comparison circuit of a second embodiment.

FIG. 5 is a circuit diagram of a comparison circuit of a second embodiment. A difference from the first embodiment shown in FIG. 1 resides in that the switches S13 and S21 are omitted and switches S14 and S22 are added. The added elements are configured and connected as follows. The following connections differ from the first embodiment due to the omitted elements.

The other terminal of a switch S12 is connected to a reference voltage input terminal Nref0. The switch S14 has two terminals, one terminal of which is connected to an output terminal OUT of a comparator 11 and the other terminal thereof is connected to the other terminal of a switch S11. The switch S22 has two terminals, one terminal of which is connected to the other terminal of the switch S11 and the other terminal thereof is connected to the other terminal of the switch S12. This other connection and configuration are the same as the first embodiment.

Next, the operation of the comparison circuit of the second embodiment will be described.

The switches S14 and S22 are controlled in on/off by switch control signals (not shown in the circuit diagram) in a manner similar to the switches S11 and S12.

Figure 6:
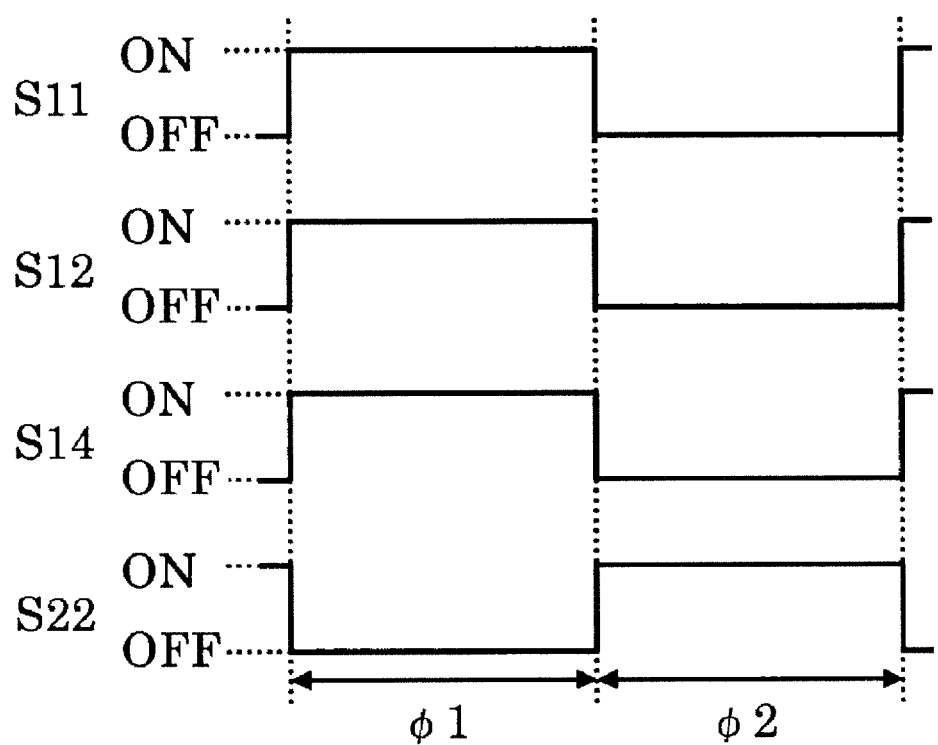
FIG. 6 is a diagram illustrating operations of respective switches of the second embodiment.

FIG. 6 is a diagram illustrating the operation of each switch in the comparison circuit of the second embodiment. The switches S11, S12 and S14 are controlled to be turned on in a sample phase $\phi1$ and turned off in a comparison phase $\phi2$. The switch S22 is controlled to be turned off in the sample phase $\phi1$ and turned on in the comparison phase $\phi2$.

In the sample phase $\phi1$, the switches S11, S12 and S14 are on and the switch S22 is turned off. Accordingly, the following voltages are supplied to each input terminal of the comparator 11. A voltage Vo of the output terminal OUT is applied to a first input terminal N3 of a first differential input pair of the comparator 11. A voltage of the reference voltage input terminal Nref0 is applied to a second input terminal N4 of the first differential input pair. A voltage of a first reference voltage input terminal Nref1 is applied to a first input terminal N5 of a second differential input pair. A voltage of a second reference voltage input terminal Nref2 is applied to a second input terminal N6 of the second differential input pair. That is, since the above is similar to the comparison circuit of the first embodiment, the operation also becomes similar to the comparison circuit of the first embodiment.

In the comparison phase $\phi2$, the switches S11, S12 and S14 are off and the switch S22 is turned on. Since the switches S11 and S12 are off, a voltage V3 is determined by a voltage V1 and $\Delta VC1\phi1$, and a voltage V4 is determined by a voltage V2 and $\Delta VC2\phi1$. That is, since the above is similar to the comparison circuit of the first embodiment, the operation also becomes similar to the comparison circuit of the first embodiment.

Since in the comparison phase $\phi2$, the switch S14 is turned off and the switch S22 is on, the voltages of the other terminals of the switches S11 and S12 become equal to the voltage of the reference voltage input terminal Nref0. In the case of the comparison circuit of the first embodiment, the voltages of the other terminals of the switches S11 and S12 are equal to the voltage Vo of the output terminal OUT of the comparator 11. This point therefore differs from the first embodiment. In the present embodiment, the switch S14 is turned off and the switch S22 is turned on in the comparison phase $\phi2$. Thus, since the voltage of one terminal of the switch S12 becomes a voltage based on the Vref0$\phi1$ expressed in the equation (15), and the voltage of the other terminal thereof becomes the voltage of Vref0$\phi1$. Therefore, the leak current becomes a relatively small leak current although it flows. Since, in regard to the switch S11, the voltage of one terminal thereof becomes a voltage based on Vref0$\phi1$ expressed in the equation (13), and the voltage of the other terminal thereof becomes the voltage of Vref0$\phi1$, the leak current becomes a relatively small leak current although it flows as with the switch S12. Thus, the difference between the difference in voltage between both terminals of the switch S11 and the difference in voltage between both terminals of the switch S12 is improved so as to be small. As with the case of the comparison circuit of the first embodiment, an error that occurs in a comparison/determination result can be reduced as a result. Accordingly, the switches S14 and S22 make it possible to suppress the influence of an error generated by the leak current of each switch and obtain a highly accurate comparison/determination result.

Further, the nonideal components of the switch include, in addition to the above leak current, a noise component generated when a transistor element that configures a switch is transitioned from on to off, e.g., channel charge injection and clock feed-through. The present embodiment is operated in such a manner that since the switches S11 and S12 are connected to a connection point of one terminal of the capacitor C1 and the first input terminal N3 of the first differential input pair of the comparator 11, and a connection point of one terminal of the capacitor C2 and the second input terminal N4 of the first differential input pair of the comparator 11 such that they become symmetrical with respect to each other respectively, electrical charges generated due to the noise components of the switches are approximately equally injected to the respective connection points, and the amounts of fluctuations in the voltage of the first input terminal N3 of the first differential input pair and the voltage of the second input terminal N4 of the first differential input pair become approximately equal to each other though both voltages fluctuate. Accordingly, it is possible to suppress the influence of an error due to the noise components generated when the switch is transitioned from the on state to the off state and obtain a highly accurate comparison/determination result. The point that it is possible to suppress the influence of the error due to the noise component generated when the switch is transitioned from the on state to the off state and obtain the highly accurate comparison/determination result is also similar to the case of the first embodiment.

Thus, the operation of the comparison circuit of the second embodiment has been described. It has been shown that it is possible to remove the influence of the input offset voltages of the comparator with the simple circuit configuration, suppress the influence of the error due to the off-leak current or the noise component of each switch and obtain the highly accurate comparison/determination result as with the first embodiment.

THIRD EMBODIMENT

Figure 7:
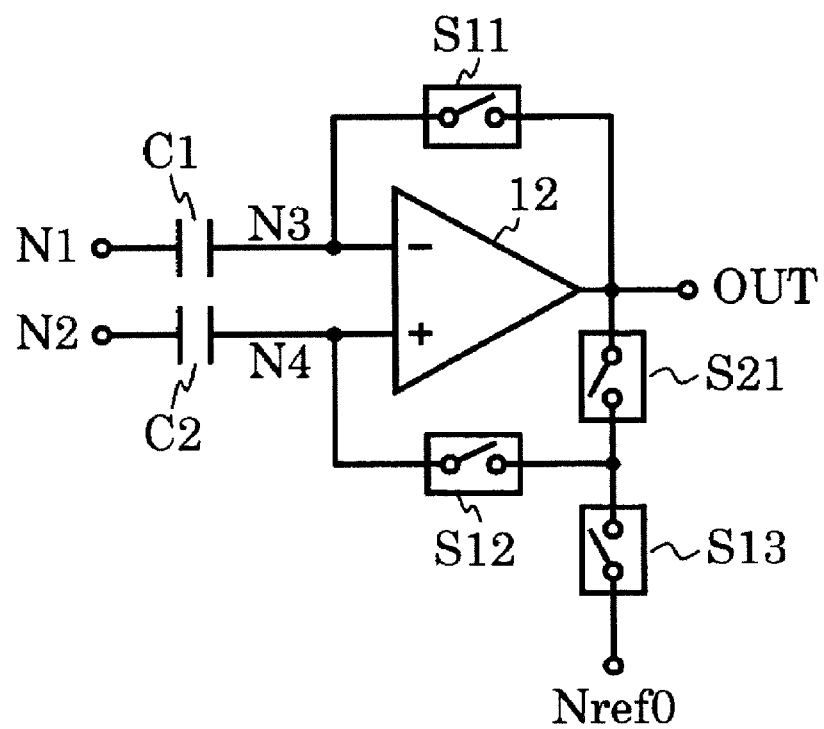
FIG. 7 is a circuit diagram of a comparison circuit of a third embodiment.

FIG. 7 is a circuit diagram of a comparison circuit of a third embodiment. Differences from the first embodiment shown in FIG. 1 reside in that the comparator 11 is replaced with a comparator 12, and the first reference voltage input terminal Nref1 and the second reference voltage input terminal Nref2 connected to the input of the comparator 11 are omitted. The replaced element is configured and connected as follows.

The comparator 12 has two input terminals and an output terminal. Specifically, the comparator 12 has a first input terminal N3 of a differential input pair, a second input terminal N4 of the differential input pair, and an output terminal OUT. The first input terminal N3 of the differential input pair of the comparator 12 is connected to one terminal of a capacitor C1, the second input terminal N4 of the differential input pair is connected to one terminal of a capacitor C2, and the output terminal OUT is connected to the other terminal of a switch S11. This other connection and configuration are the same as the first embodiment. The switches S11, S12, S13 and S21 are controlled in on/off by switch control signals (not shown in the circuit diagram) as with the comparison circuit of the first embodiment.

Next, the operation of the comparison circuit of the third embodiment will be described.

First, the operation of the comparator 12 will be described. The comparator 12 has the function of outputting a value obtained by amplifying a difference between input voltages. This amplifying function is represented by an equation as follows:

$$Vo = A3 \times (V4 - V3) \quad (25)$$

where A3 is an amplification factor of the comparator 12.

In the comparison circuit of FIG. 7, the first input terminal N3 of the differential input pair and the output terminal OUT are connected to both terminals of the switch S11. Since Vo and V3 become approximately equal voltages in a state in which the switch S11 is on, Vo is represented from the equation (25) as follows:

$$Vo = A3/(1+A3) \times V4 \quad (26)$$

For convenience of explanation, assuming that the amplification factor A3 is sufficiently large, the following equation is obtained:

$$Vo = V4 \quad (27)$$

That is, in the state in which the switch S11 is on, the output terminal OUT of the comparator 12 and the first input terminal N3 of the differential input pair are electrically connected to form a feedback loop, which performs a voltage follower operation by following the output voltage Vo to the input voltage V4.

On the other hand, since no feedback loop is formed in the comparator 12 in a state in which the switch S11 is off, the comparator 11 is operated as a comparator (comparator) itself. The operation at this time is equal to the equation (24), which is as follows:

$$Vo = A3 \times (V4 - V3) \quad (28)$$

Therefore, in other words, the comparator 12 performs, in the off state of the switch S11, a comparison operation of amplifying a voltage of a difference between V4 and V3 with the sufficiently large amplification factor A3 and outputting a high level signal (positive power supply voltage level in general) or a low level signal (negative power supply voltage level or GND level in general) from the output terminal OUT.

Here, when an input offset voltage of the comparator 12 is taken to be Voa3 at the second input terminal N4 of the differential input pair, the equation representing the operation of the comparator 12 having taken into consideration the input offset voltage is represented as follows from the equations (27) and (28) respectively when the switch S11 is on and off.

When the switch S11 is on:

$$Vo = V4 + Voa3 \quad (29)$$

When the switch S11 is off:

$$Vo = A3 \times \{(V4 + Voa3 - V3)\} \quad (30)$$

The above is the description of the operation of the comparator 12 shown in FIG. 7.

The operation of each switch is also controlled in a manner similar to the first embodiment and is made active in accordance with the diagram showing the operation of each switch in FIG. 2. The outline of operation of the comparison circuit of FIG. 7 in each phase will be described. The sample phase φ1 is a phase for storing in the capacitors C1 and C2, respective terminal voltage of the input terminal N1 and the input terminal N2 and an offset voltage of the comparator 12. The comparison phase φ2 is a phase for performing a comparison of the difference in voltage between the input terminal N1 and the input terminal N2 while canceling an offset component of the comparator 12 in the sample phase $\phi1$. Details thereof will be described below.

In the sample phase $\phi1$, the switches S11, S12 and S13 are on and the switch S21 is turned off. Thus, the voltage Vo of the output terminal OUT is applied to the first input terminal N3 of the differential input pair of the comparator 12. The voltage of a reference voltage input terminal Nref0 is applied to the second input terminal N4 of the differential input pair. Since the comparator 12 is operated as represented by the equation (29) when the switch S11 is on, the voltage of the first input terminal N3 of the differential input pair is represented as follows:

$$V3\phi1=Vref0\phi1+Voa3\phi1 \quad (31)$$

A difference $\Delta VC1\phi1$ between the voltage V3 and a voltage V1 is charged in the capacitor C1.

$$\Delta VC1\phi1=V3\phi1-V1\phi1 \quad (32)$$

Substituting the equation (31) into the above equation yields the following equation:

$$\Delta VC1\phi1=-V1\phi1+Vref0\phi1+Voa3\phi1 \quad (33)$$

On the other hand, a difference $\Delta VC2\phi1$ between the voltage V4 and a voltage V2 is charged in the capacitor C2.

$$\Delta VC2\phi1=V4\phi1-V2\phi1 \quad (34)$$

Since the voltage of the reference voltage input terminal Nref0 is applied to the second input terminal N4 of the differential input pair, the following equation is obtained from the equation (34):

$$\Delta VC2\phi1=Vref0\phi1-V2\phi1 \quad (35)$$

On the other hand, in the comparison phase $\phi2$, the switches S11, S12 and S13 are off and the switch S21 is turned on. Since the switch S11 is turned off and $\Delta VC1\phi1$ has been charged in the capacitor C1, the voltage V3 is determined by the voltage V1 and $\Delta VC1\phi1$ and represented by the following equation:

$$V3\phi2=V1\phi2+\Delta VC1\phi1 \quad (36)$$

Substituting the equation (33) indicating $\Delta VC1\phi1$ charged in the capacitor C1 into the above equation is as follows:

$$V3\phi2=V1\phi2-V1\phi1+Vref0\phi1+Voa3\phi1 \quad (37)$$

Further, since the switch S12 is turned off and $\Delta VC2\phi1$ has been charged in the capacitor C2, the voltage V4 is determined by the voltage V2 and $\Delta VC2\phi1$ and represented by the following equation:

$$V4\phi2=V2\phi2+\Delta VC4\phi1 \quad (38)$$

Substituting the equation (35) indicating $\Delta VC2\phi1$ charged in the capacitor C2 into the above equation is as follows:

$$V4\phi2=V2\phi2+Vref0\phi1-V2\phi1 \quad (39)$$

Further, since the comparator 12 is operated as represented by the equation (30) when the switch S11 is off, the voltage Vo of the output terminal OUT of the comparator 12 is represented as follows:

$$Vo\phi2=A3\times\{(V4\phi2+Voa3\phi2-V3\phi)\} \quad (40)$$

Substituting $V3\phi2$ expressed in the equation (37) and $V4\phi2$ expressed in the equation (39) into the above equation yields the following equation:

$$Vo\phi2=A3\times\{(V2\phi2-V2\phi1)-(V1\phi2-V1\phi1)+(Voa3\phi2-Voa3\phi1)\} \quad (41)$$

Here, as with the first embodiment, the input offset voltage Voa3 of the comparator 12 can be assumed to be approximately equal values in the sample phase $\phi1$ and the comparison phase $\phi2$ if the times taken for the sample phase $\phi1$ and the comparison phase $\phi2$ are times sufficiently short relative to temporal and temperature changes in the input offset voltage. Accordingly, in the equation (41), $Voa3\phi2-Voa3\phi1$ become a value of almost zero, and the offset component of the comparator 12 is removed upon the comparison operation by the comparator 12 in the comparison phase $\phi2$. Thus, the equation (41) can be represented as follows:

$$Vo\phi2=A3\times\{(V2\phi2-V2\phi1)-(V1\phi2-V1\phi1)\} \quad (42)$$

Thus, a result of comparison between the voltage input to the input terminal N1 and the voltage input to the input terminal N2 is amplified with the sufficiently large amplification factor A3 and eventually outputted as a high level signal or a low level signal from the output terminal OUT of the comparator 12.

The term of Vref0 is not included in the equation (42). As with the first embodiment, this is advantageous in that a highly accurate comparison is made possible by selecting the voltage of the reference voltage input terminal Nref0 to fall within the in-phase input voltage range of the comparator 12 even if the voltages of the input terminal N1 and the input terminal N2 fall outside the in-phase input voltage range of the comparator 12. If another expression is taken, it can be said that it is advantageous in that the in-phase input voltage range required for the comparator 12 can remarkably be relaxed.

Further, in the switches S13 and S21, the switch S13 is turned off and the switch S21 is turned on in the comparison phase $\phi2$ to perform an operation in such a manner that the voltages of the other terminals of the switch S11 and the switch S12 become equal to the voltage Vo of the output terminal OUT of the comparator 11. Accordingly, as with the first embodiment, the switches S13 and S21 make it possible to suppress the influence of an error generated by a leak current of each switch and obtain a highly accurate comparison/determination result.

Further, even in regard to the nonideal components of the switches S11 and S12, as with the first embodiment, the influence of an error due to a noise component generated when the switch is transitioned from an on state to an off state can be suppressed, and a highly accurate comparison/determination result can be obtained.

The operation of the comparison circuit of the third embodiment has been described as above. It has been shown that it is possible to remove the influence of the input offset voltage of the comparator with a simple circuit configuration, suppress the influence of an error due to an off-leak current or a noise component of each switch and obtain a highly accurate comparison/determination result.

FOURTH EMBODIMENT

Figure 8:
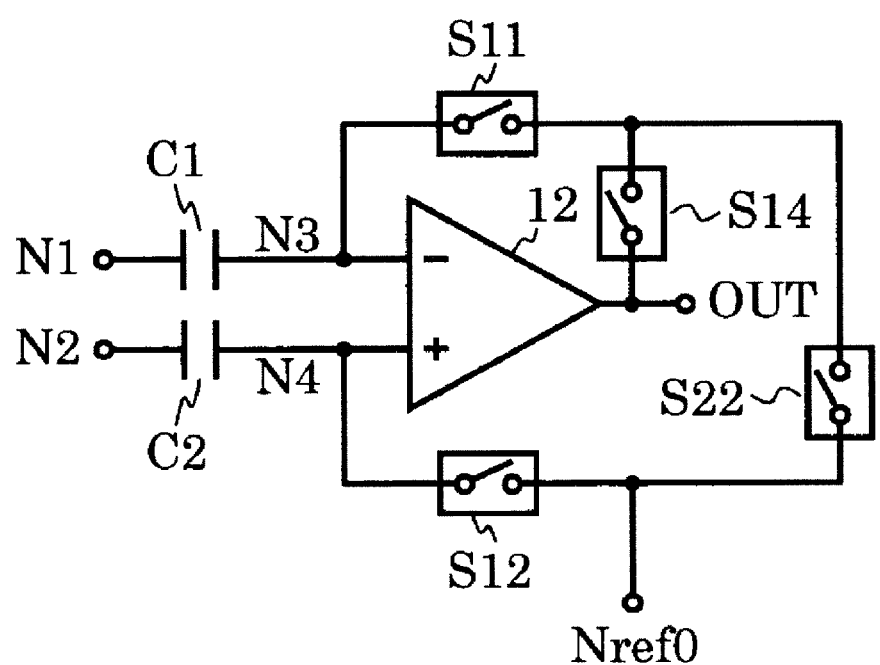
FIG. 8 is a circuit diagram of a comparison circuit of a fourth embodiment.
Figure 9:
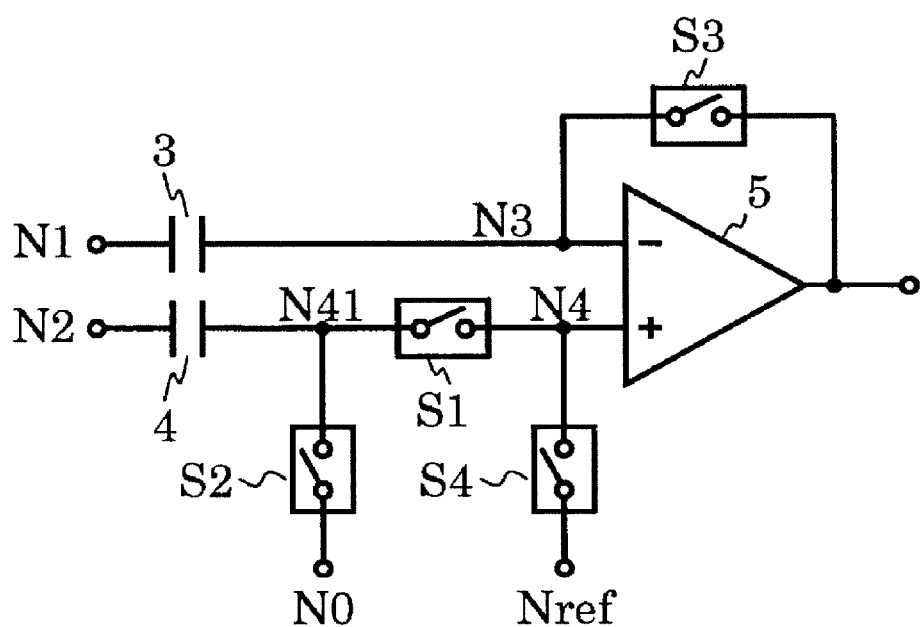
FIG. 9 is a circuit diagram of a conventional comparison circuit.
Figure 10:
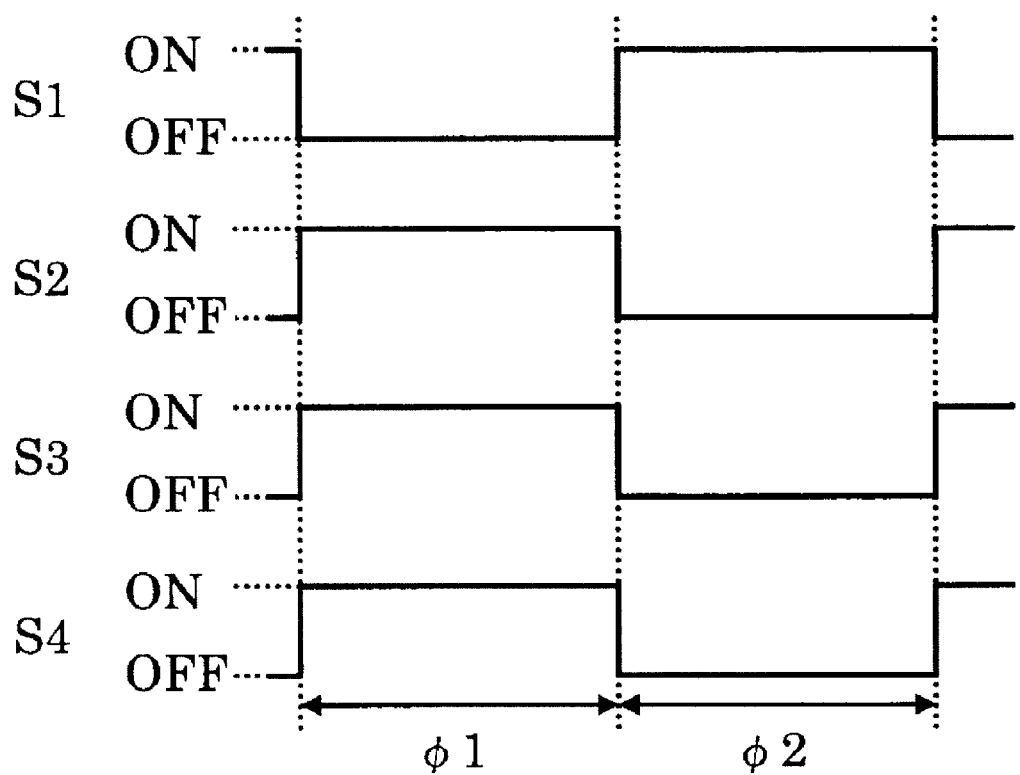
FIG. 10 is a diagram illustrating operations of respective switches of the conventional comparison circuit.

FIG. 8 is a circuit diagram of a comparison circuit of a fourth embodiment. Differences from the third embodiment shown in FIG. 7 reside in that the switches S13 and S21 are omitted and switches S14 and S22 are added. The added elements are configured and connected as follows. The following connections differ from the third embodiment due to the omitted elements.

The other terminal of a switch S12 is connected to a reference voltage input terminal Nref0. The switch S14 has two terminals, one terminal of which is connected to an output terminal OUT of a comparator 12 and the other terminal thereof is connected to the other terminal of a switch S11. The switch S22 has two terminals, one terminal of which is connected to the other terminal of the switch S11, and the other terminal thereof is connected to the other terminal of the switch S12, This other connection and configuration are the same as the third embodiment.

Further, differences between the present embodiment and the second embodiment shown in FIG. 5 reside in that as with the differences between the third embodiment shown in FIG. 7 and the first embodiment shown in FIG. 1, the comparator 11 is replaced with a comparator 12, and the first reference voltage input terminal Nref1 and the second reference voltage input terminal Nref2 connected to the input of the comparator 11 are omitted.

Next, the operation of the comparison circuit of the fourth embodiment will be described.

The switches S14 and S22 are controlled in on/off by switch control signals (not shown in the circuit diagram) in a manner similar to the switches S11 and S12. The operation of each switch is controlled as with the second embodiment and is made active in accordance with the diagram showing the operation of each switch in FIG. 6.

In a sample phase φ1, the switches S11, S12 and S14 are on and the switch S22 is turned off. Thus, each input terminal of the comparator 12 is supplied with the following voltages. A voltage Vo of the output terminal OUT is applied to a first input terminal N3 of a differential input pair of the comparator 12. A voltage of the reference voltage input terminal Nref0 is applied to a second input terminal N4 of the differential input pair. That is, since the above is similar to the comparison circuit of the third embodiment, the operation also becomes similar to the comparison circuit of the third embodiment.

In a comparison phase φ2, the switches S11, S12 and S14 are on and the switch S22 is turned on. Since the switches S11 and S12 are off, a voltage V3 is determined by a voltage V1 and $\Delta VC1\phi1$, and a voltage V4 is determined by a voltage V2 and $\Delta VC2\phi1$. That is, there is provided the comparison circuit capable of obtaining a highly accurate comparison/determination result, which becomes similar even in operation to the comparison circuit of the third embodiment since the above is similar to the comparison circuit of the third embodiment and which has an advantage that it is possible to remove an offset component of the comparator 12 and remarkably relax an in-phase input voltage range required for the comparator 12.

Further, since in the comparison phase φ2, the switch S14 is turned off and the switch S22 is on, the voltages of the other terminals of the switches S11 and S12 become equal to the voltage of the reference voltage input terminal Nref0. That is, there is provided the comparison circuit capable of suppressing the influence of an error due to a leak current of each of the switches S11 and S12 and obtaining a highly accurate comparison/determination result since the above is similar to the comparison circuit of the second embodiment.

The operation of the comparison circuit of the fourth embodiment has been described as above. It has been shown that it is possible to remove the influence of an input offset voltage of the comparator with a simple circuit configuration, suppress the influence of an error due to an off-leak current or a noise component of each switch and obtain a highly accurate comparison/determination result in a manner similar to the third embodiment.

The present description has been made by illustrating the specific example for the sake of description, but is not necessarily limited to this configuration and switch control timing. This is similar even to the cases of the comparison circuits of the first, second and third embodiments.

What is claimed is:

1. A comparison circuit comprising:
   a first capacitor and a second capacitor;
   a comparator having a first input terminal that receives a first input voltage through the first capacitor, a second input terminal that receives a second input voltage through the second capacitor, and an output terminal;
   a reference voltage terminal that receives a reference voltage;
   a first switch having a first end connected to the first input terminal and a second end connected to the output terminal, the first switch configured to turn on in a sample phase to set a voltage of the first input terminal as a voltage of the output terminal;
   a second switch having a first end connected to the second input terminal and configured to turn on in the sample phase to set a voltage of the second input terminal as the reference voltage; and
   a third switch between the output terminal and a second end of the second switch and configured to turn on in a comparison phase to equalize voltages of the second end of the first switch and the second end of the second switch.

2. The comparison circuit according to claim 1 further comprising a fourth switch between the second end of the second switch and the reference voltage terminal and configured to turn on in a sample phase and,
   wherein the third switch is further configured to set voltages of the second end of the first switch and the second end of the second switch as a voltage of the output terminal.

3. The comparison circuit according to claim 1 further comprising a fourth switch between the second end of the first switch and the output terminal and configured to turn on in a sample phase, and
   wherein the third switch is further configured to set voltages of the second end of the first switch and the second end of the second switch as the reference voltage.

4. The comparison circuit according to claim 1, wherein the comparator further comprises:
   a first amplifier connected to the first input terminal and the second input terminal, and
   a second amplifier connected to a third input terminal and a fourth input terminal, and
   wherein the third input terminal receives a second reference voltage and the fourth input terminal receives a third reference voltage.

* * * * *